United States Patent [19]

Jorke

[11] Patent Number: 5,798,539

[45] Date of Patent: Aug. 25, 1998

[54] BIPOLAR TRANSISTOR FOR VERY HIGH FREQUENCIES

[75] Inventor: Helmut Jorke, Gestetten, Germany

[73] Assignee: Daimler Benz AG, Stuttgart, Germany

[21] Appl. No.: 838,913

[22] Filed: Apr. 11, 1997

Related U.S. Application Data

[63] Continuation of Ser. No. 448,506, filed as PCT/EP93/03462 Dec. 9, 1993 published as WO94/14197 Jun. 23, 1994, abandoned.

[30] Foreign Application Priority Data

Dec. 10, 1992 [DE] Germany .......................... 42 41 609.4

[51] Int. Cl.$^6$ ................ H01L 31/0328; H01L 31/0336; H01L 31/072

[52] U.S. Cl. ..................... 257/197; 257/198; 257/191

[58] Field of Search ................. 257/19, 12, 197, 257/191, 557, 558, 565, 586, 593, 616

[56] References Cited

FOREIGN PATENT DOCUMENTS 4039103  10/1991  Germany .

OTHER PUBLICATIONS

Iyer et al., Heterojunction Bipolar Transistors Using Si–Ge Alloys, IEEE Trans on Elec. Dev. v. 36, No. 10, Oct. 1989 pp. 2043–2063.

Gary L. Patton et al.: "Graded–SiGe–Base, Poly–Emitter Heterojunction Bipolar Transistors". In: IEEE Electron Device Letters, vol. 10, No. 12, Dec. 1989, pp. 534–536.

M. Karlsteen et al.: "Optimized Frequency Characteristics of Si/SiGe heterojunction and Conventional Bipolar Transistors". In: Solid–State Electronics, vol. 33, No. 2, 1990, pp. 199–204.

C.Y. Change et al.:"Molecular beam epitaxially grown circular U–groove barrier transistor." In: Appl. Phys. Lett. 46 (11), Jun. 1, 1985, pp. 1084–1086.

Muhammad I. Chaudhry: "Electrical Tansport Properties of Crystalline Silicon Carbide/Silicon Heterojunctions" In: IEEE Electron Device Letters, vol. 12, No. 12, Dec. 1991, pp. 670–672.

K.W. Gossen et al.: "Monolayer δ–doped heterojunction bipolar transistor characteristics from 10 to 350 K". In: Appl. Phys. Lett. 59 (6), Aug. 5, 1991, pp. 682–684.

T.Y. Kuo et al.: "Planarized Be δ–Doped Heterostructure Bipolar Transistor Fabricated Using Doping Selective Contact and Selective Hole Epitaxy". In: Jap. Journal of Appl. Phys. vol. 30, No. 2B, Feb. 91, pp. L262–L265.

A. Pruijmboom et al.: "Heterojunction Bipolar Transistors with SiGe Base Grown by Molecular Beam Epitaxy". In: IEEE Electron Device Letters, vol. 12, No. 7, Jul. 1991, pp. 357–359.

Theodore I. Kamins et al.: "Small–Geometry, High–Performance, Si—$Si_{1-x}Ge_x$ Heterojunction Bipolar Transistors". In: IEEE Electron Device Letters, vol. 10 No. 11, Nov. 1989, pp. 503–505.

Shih–Chih Chen et al.: "The Fabrication and Study of InGaAsP/InP Double–Collector Heterojunction Bipolar Transistors". In: Solid–State Electronics 34 (1991) Jul., No. 7, pp. 787–794.

*Primary Examiner*—Wael Fahmy
*Attorney, Agent, or Firm*—Spencer & Frank

[57] ABSTRACT

Bipolar transistor for very high frequencies having a delta-p-doped base layer and a drift zone between the base layer and an $n^+$-doped collector terminal layer, the drift zone, at least in a base-end region, being made of a material having a split conduction band structure which, in the drift direction, energetically favors light electrons.

20 Claims, 4 Drawing Sheets

BIPOLAR TRANSISTOR FOR VERY HIGH FREQUENCIES

This Application is a Continuation of application Ser. No. 08/448,506, filed as PCT/EP93/03462 Dec. 9, 1993 published as WO94/14197 Jun. 23, 1994, now abandoned.

BACKGROUND OF THE INVENTION

1. Field of the Invention

The invention relates to a bipolar transistor, in particular, for very high frequencies.

2. Description of the Related Art

There is a demand for transistors for very high frequencies above $10^{10}$ Hz. In this regard, several realization proposals have already been made.

In Solid State Electronics, Vol. 33, No. 2, p. 199–204, 1090, for example, a configuration for an Si/SiGe heterobipolar transistor (HBT) is described having a highly p-doped SiGe base layer between n-doped Si layers for collector and emitter. A drift zone disposed between base layer and highly n-doped collector terminal layer comprises a slightly n-doped Si layer, which reduces the collector-base capacitance and increases the dielectric strength. In the literature, the drift zone layer is usually identified as part of the collector.

In IEEE Electron Device Letters, Vol. 10, No. 12, December 1989, an Si/SiGe HBT is described having an SiGe base layer, in which HBT the Ge content within the base increases from the emitter end toward the collector end, a fact which, based on the resulting varying band gap, is intended to generate a base-internal drift field so as to accelerate the transport of the charge carriers through the base, with the charge carriers being injected by the emitter.

A more general examination of the use of SiGe mixed crystal lattices in an HBT is provided in IEEE Transactions on Electron Devices, Vol. 36, No. 10, October 1989, also, in particular, considerations regarding the pseudomorphic growth of SiGe layers on an Si substrate and the influences on the band structure resulting from the lattice strain.

DE 40 39 103 A1 describes an Si bipolar transistor wherein emitter, base and collector are configured as laterally structured planes doped in planar fashion within a carrier material, wherein a deepening of the potential well for holes in the valence band is aimed at by configuring the carrier material in the region of the base plane as SiGe mixed crystals.

In Appl. Phys. Lett. 46 (11), June 1985, p. 1084–1086, a GaAs bipolar transistor is described having a $\delta(p^+)$-doped base between slightly n-doped injection zones and drift zones. The height of the potential barrier formed by the base layer can be controlled via a voltage that is applied to the base. The current over the barrier can be described according to the theory of thermionic emission.

It is the object of the present invention to propose a bipolar transistor for very high frequencies.

SUMMARY OF THE INVENTION

This object is accompanied by providing a bipolar transistor having a $\delta$p-doped base layer (3) and a drift zone (2) between base and an $n^+$-doped collector terminal layer (1), wherein the drift zone at least at the base-end comprises a region having a split conduction band structure which, in the drift director, energetically favors light electrons. The dependent claims contain advantageous embodiments and modifications of the invention. In particular, the region advantageously comprises at least 20% of the width (L2) of the drift zone. Moreover, the energy splitting of the conduction band structure in the drift zone advantageously varies in the drift direction and reaches its maximum value at the layer boundary to the base layer. The region having a split conduction band structure is advantageously comprised of SiGe which is pseudomorphically grown in the (100)-orientation on Si. The Ge content in the drift zone advantageously rises from 0% at the boundary to the collector terminal layer to a maximum of 40% at the base. The base layer advantageously comprises pseudomorphically grown SiGe. Preferably, the width of the base layer is smaller than 10 nm. The base layer advantageously has a p-surface doping of at least $10^{13}$ doping atoms/cm$^2$. The emitter is advantageously configured as a $\delta$n-doped layer. The transistor is advantageously configured in mesa design.

Here, $\delta$-doping is to be understood as a layer thickness of the base layer, with the thickness being smaller than the coherence length of the holes in the base so that a two-dimensional charge carrier gas is formed. At room temperature, the coherence length of the holes in silicon amounts to approx. 10 nm.

An energetic splitting of a conduction band minimum with a previous multiple degeneracy into two energetically separated minima having different effective masses is known, for example, for SiGe which was pseudomorphically grown on silicon. Silicon has a sixfold degenerated conduction band minimum which is split in a pseudomorphous SiGe layer grown on Si in the (100)-direction into an energetically deeper-lying fourfold degenerated minimum and an energetically higher-lying twofold degenerated minimum with different anisotropic effective masses of the electrons in the respective conduction band minima. In the drift direction, i.e., parallel to the direction of growth and perpendicular to the layer planes, the electrons in the deeper-lying conduction band minimum have a lesser effective mass, i.e., they are lighter than the electrons in the energetically higher-lying conduction band minimum.

The $\delta$-doped base layer in connection with an SiGe-containing drift zone has a particularly favorable high-frequency response. This can be explained through a function of the potential barrier of the thin base as mass filter for the injected electrons, with the filter effecting a preferred injection of the electrons having the lesser effective mass in the drift direction. The light electrons reach a higher drift speed in the electrical field of the drift zone. The germanium content in the portion of the drift zone facing the base layer is of particular importance.

BRIEF DESCRIPTION OF THE DRAWINGS

In the following, the invention is illustrated in greater detail by way of embodiments with reference to the drawings without limiting the inventive idea to the material combinations selected in the examples.

DESCRIPTION OF THE PREFERRED EMBODIMENTS

Figure 1B:
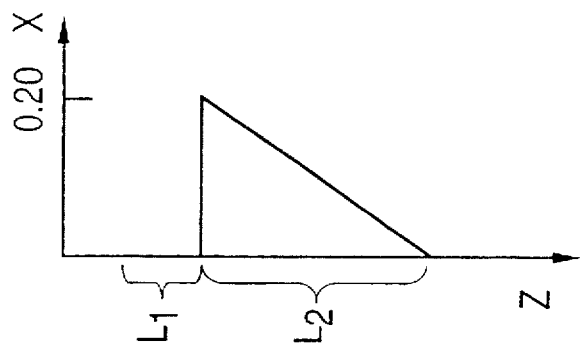
FIG. 1a illustrates a bipolar transistor in mesa design having an $n^+$-n-$\delta$p-n-$n^+$ structure FIG. 1b indicates the Ge portion in the base layer
FIG. 1c illustrates the doping profiles and the schematic energy band curves
Figure 1A:
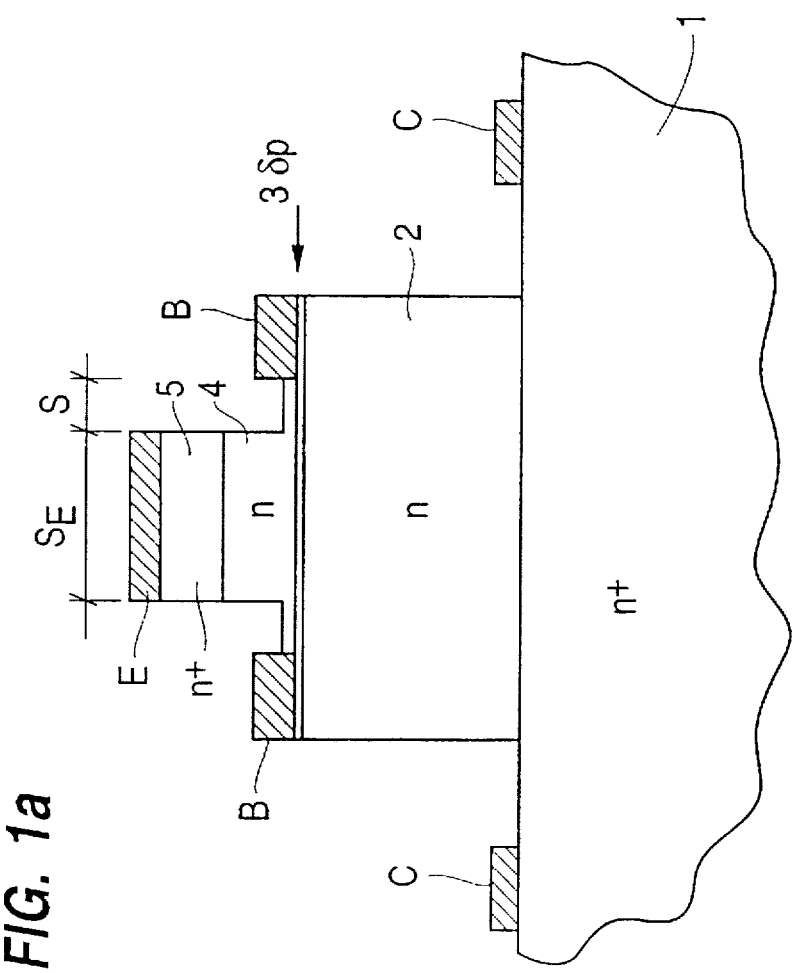

The configuration of a bipolar transistor in mesa design which is outlined in FIG. 1a has an $n^+$-n-$\delta$p-n-$n^+$ layer sequence. The lowest layer 1 is made of n+-doped silicon having a doping material concentration of, e.g., $10^{20}$ cm$^{-3}$ and forms the collector terminal layer. The layer 2 grown on top of this is slightly n-doped having a doping material concentration of, e.g., $5 \cdot 10^{16}$ cm$^{-3}$ and forms the drift zone. Frequently, this layer 2 is also identified as part of the collector. The width L2 of the drift zone amounts to, e.g., 100 nm. The layer 2 comprises pseudomorphously grown SiGe. The germanium content x in the $Si_{1-x}Ge_x$-mixed crystal is below x=0.4, preferably at x<0.2, with the Ge concentration increasing from the collector end toward the base end. The germanium content in the drift zone preferably is at a maximum at the layer boundary toward the base layer. The germanium content in the base layer is largely not critical.

Also, the drift zone may be comprised of pseudomorphically grown SiGe only in a region facing the base layer, with this region merely corresponding to a portion of the width L2, and be comprised of Si in the portion of the drift zone facing the collector layer 1, with the SiGe region advantageously accounting for at least 20% of the drift zone width L2 starting from the base layer. Preferably, the germanium content in a layer thickness of at least 20 nm is higher than 10%. The curve of the germanium content may be constant in the entire drift zone or preferably drop in linear or monotonal fashion or also stepwise, starting from the base layer end of the drift zone.

The base layer 3 is δp-doped; because of the small thickness of the base layer having only a few nm, the doping can be indicated as surface doping with a doping material concentration of, e.g., $10^{14}$ cm$^{-2}$. The base layer is made of Si or of pseudomorphically grown SiGe preferably having a constant Ge-content which is equal to the Ge content of the drift zone at the boundary to the base layer.

The layer 4 is a slightly n-doped Si layer having a doping material concentration of, e.g., $5 \cdot 10^{16}$ cm$^{-3}$ and it forms the injection zone. The width L1 of the injection zone amounts to, for example, 50 nm. Frequently, the injection zone is identified as part of the emitter.

The layer 5 is made of n+-doped silicon having a doping material concentration of, e.g., $10^{20}$ cm$^{-3}$ and a layer thickness of, e.g., 100 nm and forms a low-resistance emitter contact layer.

Boron (B) is preferably used as doping material for the base layer and arsenic (As) or antimony (Sb) as doping material for the n-doped or n+-doped layers.

The metallic contacts for emitter, base and collector are identified as E, B and C.

The width $S_E$ of the emitter is assumed to be, for example, 1 μm, the base-emitter distance S approximately 0.5 μm. The bipolar transistor can be fabricated coventionally.

Figure 1C:
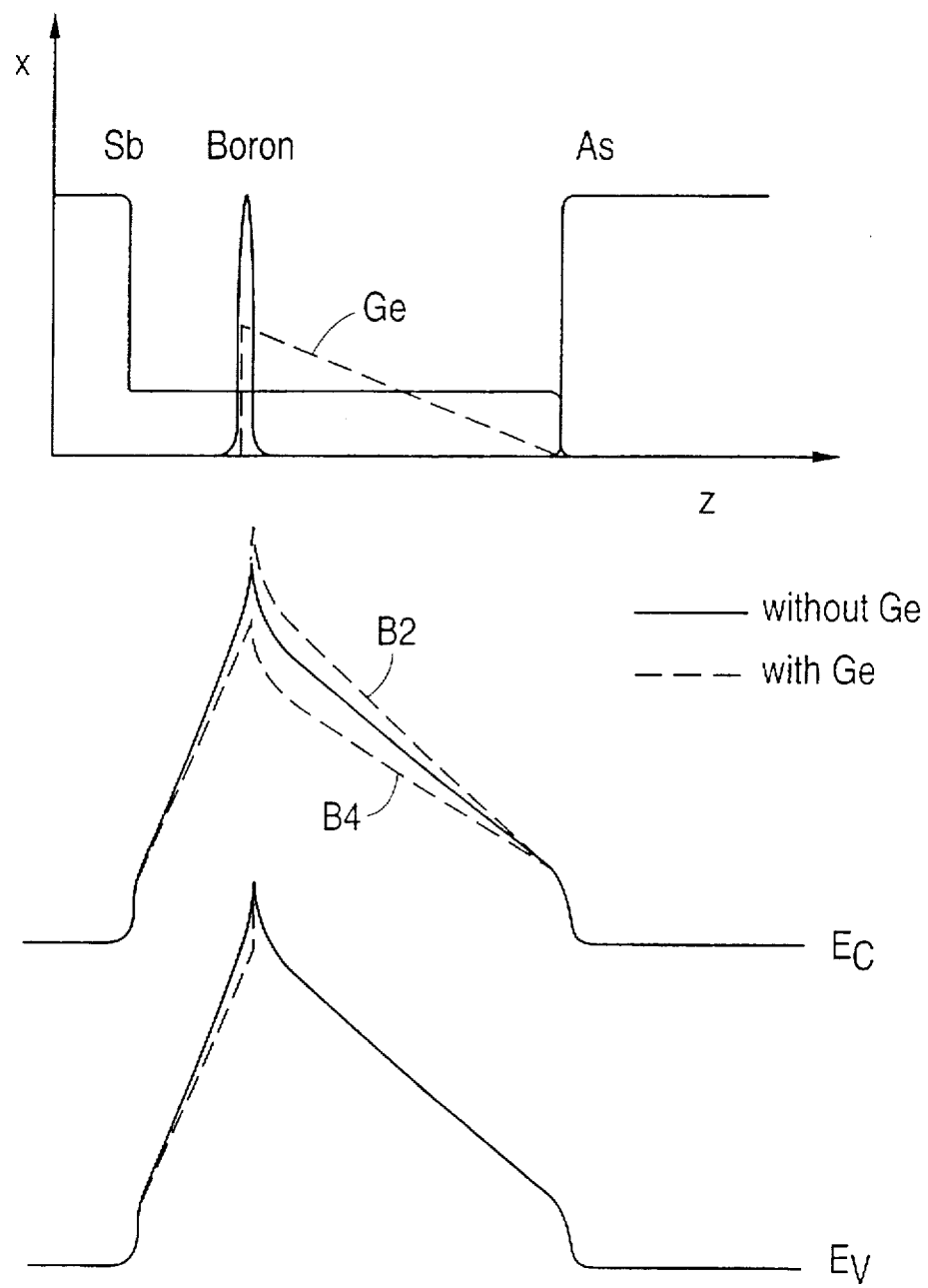

If the drift zone at the boundary to the base layer comprises a Ge portion of, e.g. x≦0.2 having a Ge distribution corresponding to FIG. 1b, then shorter transit times in the drift zone are accomplished because, due to a pseudomorphic growth of SiGe on Si (001), a splitting of the sixfold degenerated conduction band minimum in the drift zone into a twofold and fourfold degenerated minimum takes place (FIG. 1c) and the charge carriers are injected preferably from the injection zone into the energetically more favorable fourfold degenerated minimum of the drift zone. The charge carriers in the energetically reduced, fourfold degenerated minimum have a lesser effective mass in the drift direction and thus an increased drift speed.

Figure 2B:
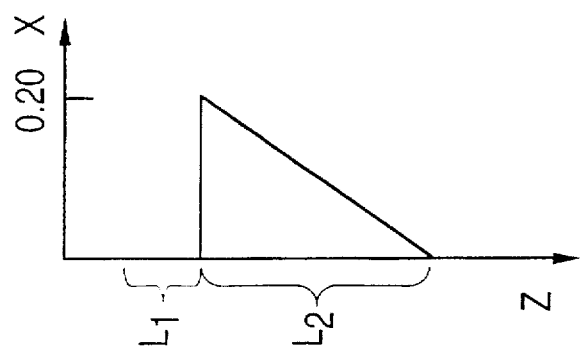
FIG. 2a illustrates a planar bipolar transistor having a $\delta$n-n-$\delta$p-n-$n^+$ structure FIG. 2b indicates the Ge portion in the base layer
FIG. 2c illustrates the doping profiles and the schematic energy band curves.
Figure 2A:
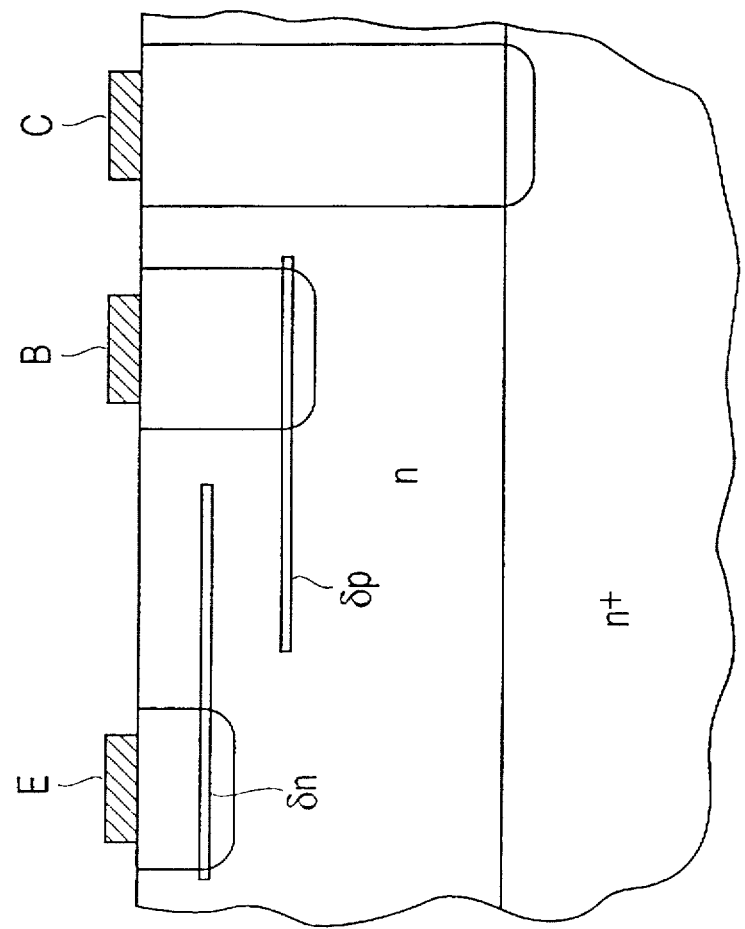
Figure 2C:
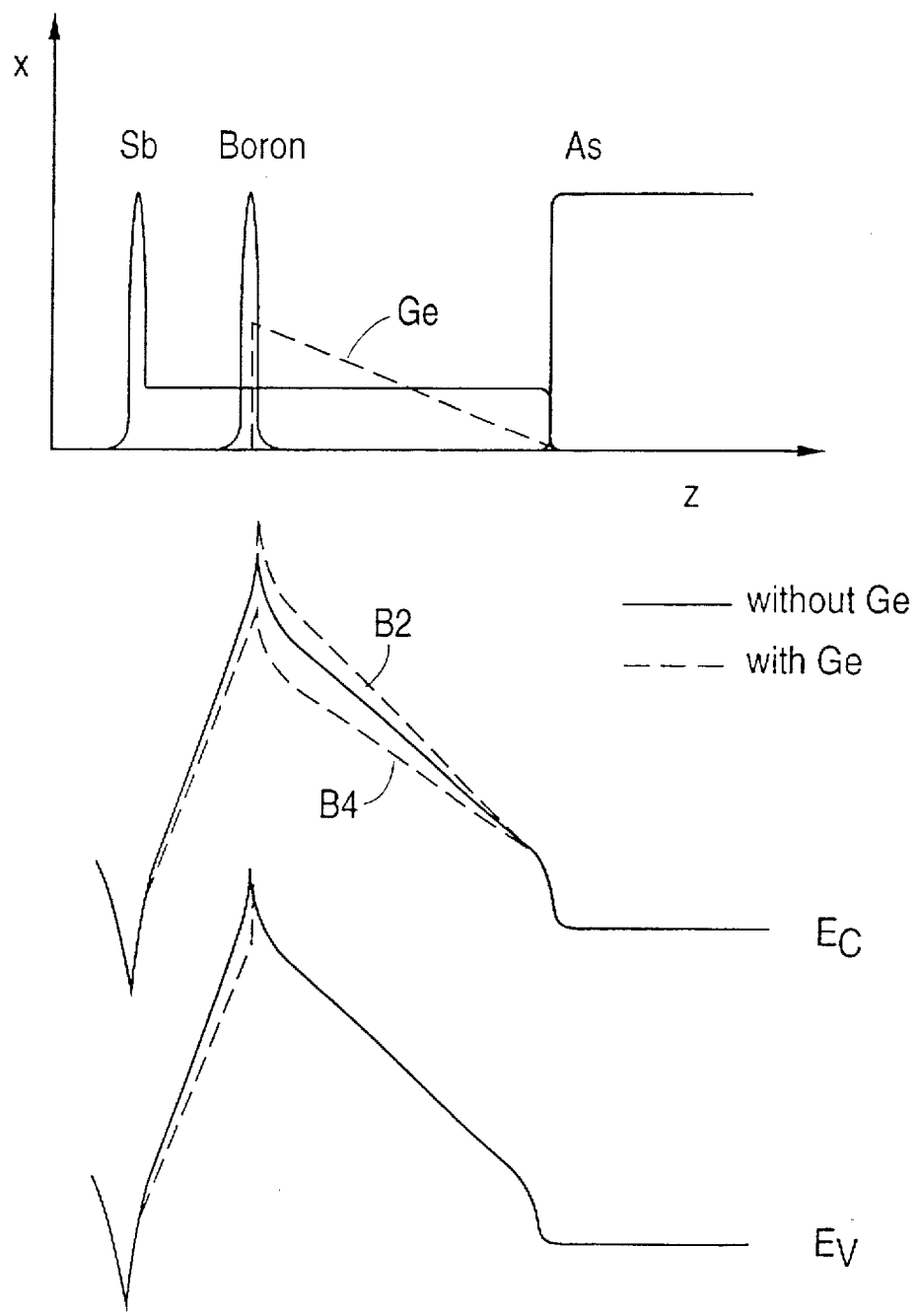

FIG. 2a illustrates a bipolar transistor structure comprising both a δ-doped base as well as a δ-doped emitter. Such a structure considerably reduces the storage times for minority carriers (electrons in the base, defect electrons in the emitter). For example, on an n+-doped collector layer made of silicon having a charge carrier concentration of, e.g., $10^{20}$ As/cm$^3$, a silicon layer is applied having a thickness of approximately 100 nm and a charge carrier concentration of approximately $5 \cdot 10^{16}$ cm$^{-3}$. At a distance of approximately 100 nm from the collector layer, a first δ-doping δp having a surface doping of, e.g., $10^{14}$ B/cm$^2$ for the base and, approximately 50 nm above the δp-doping, a second δ-doping δn having a surface doping of, e.g., $10^{14}$ Sb/cm$^2$ are introduced into the n-doped silicon layer by means of suitable masks. Subsequently, by way of contact implantation, contact zones are generated which connect the active component regions with the contacts arranged in planar fashion on the surface of the layer sequence. If the drift zone between collector layer and the first δ-doping δp contains a Ge-portion according to FIG. 2b, the drift speed is increased in an advantageous manner, as described above. The dopings associated with the planar bipolar transistor structure and the energy band curves are illustrated in FIG. 2c.

Cut-off frequencies $f_{max}$ exceeding 100 GHz are achieved with the proposed low-noise bipolar transistors.

The invention is not limited to the cited transistor structures, but transistors having p+-p-δn-p-p+ as well as δp-p-δn-p-p+ structures can also be fabricated for which the above-described properties for the conduction band structure must then also be transferred to the valence band structure.

The invention is also not limited to the Si/SiGe material combination which was selected by way of example and which has been particularly well researched, but is applicable in general to semiconductor materials which have the conduction band splitting with a deeper-lying conduction band minimum for light electrons in the drift direction such as, e.g., AlAs.

What is claimed is:

1. A bipolar transistor for very high frequencies, comprising:

an n+-doped collector terminal layer;

a delta-p-doped base layer containing no germanium; and a layer including a drift zone having a drift direction provided between the delta-p-doped base layer and the n+-doped collector terminal layer, wherein the drift zone is comprised, at least in an end region thereof adjacent to the delta-p-doped base layer, of a material having a split conduction band structure whose multiply degenerated conduction band minimum is split into at least two energetically separated conduction band minima with different anisotrophic effective masses of electrons, and wherein an energetically deeper-lying conduction band minimum comprises electrons with a lesser effective mass which are energetically favored in the drift direction.

2. The bipolar transistor according to claim 1, wherein the drift zone has a width, and wherein the end region thereof adjacent to the delta-p-doped base layer comprises at least 20% of the width of the drift zone.

3. The bipolar transistor according to claim 1, wherein the energy splitting of the conduction band structure of the material in the drift zone varies in t the drift direction and reaches its maximum value at the end region thereof adjacent to the delta-p-doped base layer.

4. The bipolar transistor according to claim 1, wherein the material having a split conduction band structure comprises SiGe which is pseudomorphically grown in the (100)-orientation on Si and which has a pseudomorphically grown structure.

5. The bipolar transistor according to claim 4, wherein the Ge content of the material in the drift zone rises from 0% at the boundary to the $n^+$-doped collector terminal layer to a maximum of 40% at the delta-p-doped base layer.

6. The bipolar transistor according to claim 3, wherein the delta-p-doped base layer has a width, and wherein the width of the delta-p-doped base layer is less than 10 nm.

7. The bipolar transistor according to claim 1, wherein the delta-p-doped base layer has a p-surface doping of at least $10^{13}$ doping atoms/cm$^2$.

8. The bipolar transistor according to claim 1, further comprising an emitter layer which is a delta-p-doped layer.

9. The bipolar transistor according to claim 1, wherein the bipolar transistor has a mesa structure.

10. The bipolar transistor according to claim 1, further comprising an n-doped Si layer including an injection zone.

11. The bipolar transistor according to claim 10, wherein the n-doped Si layer contains no germanium.

12. A bipolar transistor having an $n^+$-n-$\delta$p-n-$n^+$ structure for very high frequencies, comprising, in the order recited:

a collector terminal layer formed of $n^+$-doped Si;

a layer which includes a drift zone having a drift director and which is n-doped;

a base layer which is delta-p-doped;

a layer which consists essentially of n-dope Si and contains no germanium;

and a low resistance emitter contact layer which consists essentially of $n^+$-doped Si, wherein the drift zone is comprised, at least in an end region thereof adjacent to the base layer, of a material having a split conduction band structure whose multiply degenerated conduction band minimum is split into at least two energetically separated conduction band minima with different anisotropic effective masses of electrons, and wherein an energetically deeper-lying conduction band minimum comprises electrons with a lesser effective mass which are energetically favored in the drift direction.

13. The bipolar transistor according to claim 12, wherein the drift zone has a width, and wherein the end region thereof adjacent to the base layer comprises at least 20% of the width of the drift zone.

14. The bipolar transistor according to claim 12, wherein the energy splitting of the conduction band structure of the material in the drift zone varies in the drift direction and reaches its maximum value at the end region thereof adjacent to the base layer.

15. The bipolar transistor according to claim 14, wherein the base layer is made of pseudomorphically grown SiGe and has a pseudomorphically grown structure.

16. The bipolar transistor according to claim 14, wherein the base layer has a width, and wherein the width of the base layer is less than 10 nm.

17. The bipolar transistor according to claim 12, wherein the material having a split conduction band structure comprises SiGe which is pseudomorphically grown in the (100)-orientation on Si and has a pseudormorphically grown structure.

18. The bipolar transistor according to claim 17, wherein the SiGe has a Ge content, and wherein the Ge content of the material in the drift zone rises from 0% at the boundary to the collector terminal layer to a maximum of 40% at the base layer.

19. The bipolar transistor according to claim 12, wherein the base layer has a p-surface doping of at least $10^{33}$ doping atoms/cm$^2$.

20. The bipolar transistor according to claim 12, wherein the bipolar transistor has a mesa structure.

* * * * *